United States Patent [19]

Laiming

[11] 3,903,344

[45] Sept. 2, 1975

[54] ADHERENT SOLDERABLE CERMET CONDUCTOR

[75] Inventor: Harry John Laiming, Moorestown, N.J.

[73] Assignee: RCA Corporation, New York, N.Y.

[22] Filed: Feb. 26, 1974

[21] Appl. No.: 445,969

[52] U.S. Cl. ................ 428/213; 427/125; 428/336; 428/411; 428/426

[51] Int. Cl.$^2$ ........................ B32B 7/02; B44D 1/18

[58] Field of Search .................... 117/217, 227, 212; 252/514, 518; 106/1

[56] References Cited

UNITED STATES PATENTS

| | | | |
|---|---|---|---|
| 3,374,110 | 3/1968 | Miller | 117/217 |
| 3,385,799 | 5/1968 | Hoffman | 117/227 |
| 3,502,489 | 3/1970 | Cole | 117/227 |
| 3,537,892 | 11/1970 | Milkovich et al. | 117/227 |
| 3,741,780 | 6/1973 | Hoffman | 117/227 |
| 3,746,568 | 7/1973 | Rybarczyk | 117/227 |
| 3,793,064 | 2/1974 | Budd et al. | 117/217 |
| 3,827,891 | 8/1974 | Larry | 117/227 |

*Primary Examiner*—Cameron K. Weiffenbach
*Attorney, Agent, or Firm*—Glenn H. Bruestle; William S. Hill; Birgit E. Morris

[57] ABSTRACT

An article comprising a ceramic substrate having an electrically conductive fired cermet type coating thereon, the coating having a lower layer which is glass-rich and an upper layer which has a low glass content.

8 Claims, 2 Drawing Figures

ADHERENT SOLDERABLE CERMET CONDUCTOR

BACKGROUND OF THE INVENTION

Cermet materials are composed of a glass or ceramic frit and metal or metal oxide particles. The metals are usually the noble metals such as gold, silver, platinum or palladium although metals such as copper may also be included. When used as inks which may be screen printed onto a ceramic substrate and fired to fuse the glass particles, the compositions also contain temporary resin binders and solvents which are present only to aid the printing process. The binders and solvents are driven off during drying and firing operations to which the printed patterns are subjected.

In cermet ink compositions for printing on ceramic substrates, the glass component is present to secure good adherence to the ceramic. The percentage of metals (and/or metal oxides) is adjusted to obtain some desired degree of conductivity.

Sometimes it is desirable to apply a layer of solder over a printed and fired cermet conductor. The solder may be needed either to attach a circuit component or a connector, for example, or it may be required if the printed conductor is to have a metal cover sealed across it and to the adjacent substrate. Cermet conductors made out of most of the usual commercial compositions are not usually solderable to the degree desired.

It is desirable, for a number of applications, to have a printed cermet conductor system which has both good adherence to a ceramic substrate and very good solderability.

THE DRAWING

FIG. 1 is a plan view of part of a ceramic based thick-film circuit including terminals for mounting a semiconductor device or circuit chip thereon, and FIG. 2 is a section view taken through the line 2—2 of FIG. 1.

DESCRIPTION OF PREFERRED EMBODIMENT

Figure 1:
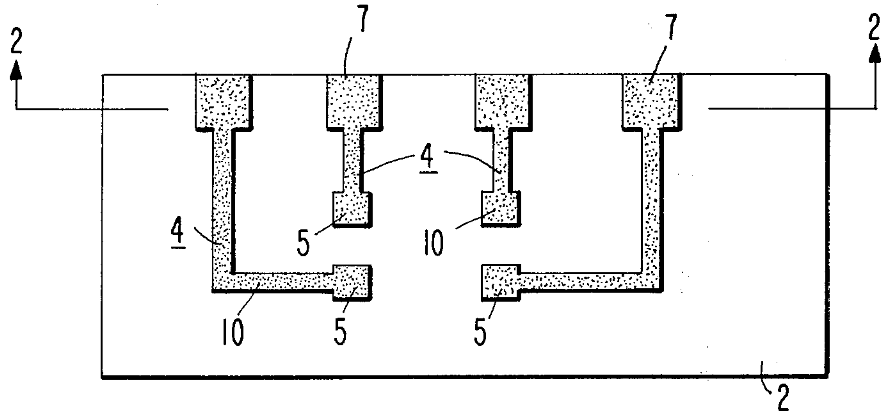
Figure 2:
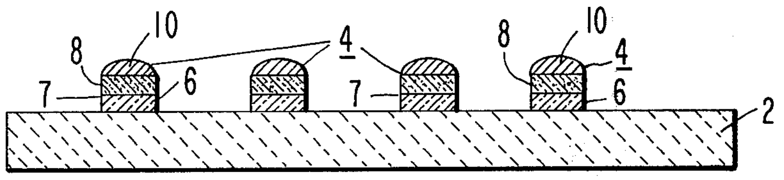

The following example is a preferred embodiment of a conductor in accordance with the present invention.

Substrates containing a high percentage of alumina ($Al_2O_3$) or Beryllia (BeO) are preferred in making many types of thick-film hybrid circuits. Such circuits usually comprise a pattern of printed resistors and capacitors and other components such as inductors and semiconductor devices or monolithic integrated circuits mounted on the substrate. The various parts of the complete circuit are connected with printed conductors.

In the drawing, only a portion of a circuit is shown. This portion comprises a ceramic substrate 2 and a pattern of conductors 4 which include device mounting pads 5 and connecting pads 7. The substrate preferably comprises about 96% alumina. Although ceramic substrates having other percentages of alumina are commercially used, if the percentage is appreciably lower, say lower than about 86% alumina and 14% glass, the surface is too rough and mechanically weak for some uses. If the percentage is higher, say 99% with 1% frit (glass), the surface is usually so smooth and lacking in glass for adhesion that adherence of the printed conductors becomes a problem. Therefore, the percentage of alumina should be less than 99%.

The pattern of conductors 4 comprises a lower or underlayer 6 composed of a fired cermet composition made up of about 10–12% by weight of a glass frit and the remainder a mixture of powdered gold and platinum such as 75% by weight gold/25% by weight platinum or silver-palladium such as 80% by weight silver/20% by weight palladium. Examples of suitable compositions are No. 8553 and No. 8151, respectively, made and marketed by E. I. du Pont de Nemours. The thickness of the fired layer 6 is preferably about 0.3 to 0.4 mil (7.6–10.2 microns). The composition is deposited by screen printing. To make the composition printable it contains a solvent such as butyl carbitol acetate and a temporary binder such as ethyl cellulose or nitrocellulose. The solvent should not be too volatile since, if too volatile, the viscosity will increase too rapidly during the printing operation as the solvent evaporates. The vehicle (solvent and binder) is usually about 25% by weight of the ink composition.

Printing may be done using a 200–325 mesh screen. After printing, the solvent may first be partially evaporated by permitting the printed conductor layer to dry in air at room temperature and then the remainder of the solvent may be removed by drying under an infrared lamp at about 125° C.

On top of the underlayer 6 an upper layer 8 of a different cermet ink composition is screen-printed. The composition of the layer 8 (after firing) preferably includes only 1–2% by weight glass frit and the remainder, as in the lower layer 6, a mixture of finely divided platinum and gold (or palladium and silver). An example of this type of special formulation composition is No. 8738 ink also made and marketed by E. I. du Pont de Nemours. The thickness of the layer 8 may be 0.8 to 1.2 mil (20.3–30.5 microns) and, in general, it is more than twice the thickness of the lower layer 6.

Both of the layers 6 and 8 are then fired together for about 10 minutes at 900° C in air. The glasses and metals of both layers fuse together.

The underlayer 6 must not be too thick. If it is too thick, some of the glass from this layer rises through the top layer 8 and interferes with the adherence of the solder layer which is latter applied. Also, if the proportion of glass-to-metal is too low, there will not be optimum adherence of the composite layer 4 to the substrate 2 at high operating temperatures such as 150° C.

Although different types of glasses may comprise the glass frits in the compositions mentioned above, a preferred glass is one containing oxides of bismuth, boron, lead and cadmium in addition to silica.

After the firing step, a layer of solder 10 such as a tin, lead, silver solder known as "SN62" made and marketed by Alpha Metals Inc. may be applied to the top of the upper cermet layer 8. The solder may be applied in molten form and allowed to solidify. Alternatively it may be applied as a paste which is later reflowed. Better wetting of the cermet layer 8 by the solder layer 10 can be obtained if the surface of the layer 8 is first treated with a flux such as a clear resin or a dimer acid.

When made as described in this example, the solder layer 10 will withstand a peel test of 40–60 lbs./inch width (714–1071 kg/meter width). Improved adherence to the substrate and adherence of the solder is evidenced even when the equipment containing this circuit is operated at temperatures of 150° C.

Although, in the above example, the lower layer 6 was a commercially available cermet ink composition, this layer may also comprise a glass frit with no metal component. In this case, the layer must be very thin, of the order of 0.0001 inch (0.000254 cm) thick, so that additional glass will not rise through the upper layer 8 during the firing operation. This thickness dimension applies to that part of the glass layer 6 above the top surfaces of the surface layer of crystals of the substrate. The glass layer is thicker in the crevices between the crystals. A suitable glass composition for the all-glass layer is one made up of $Bi_2O_3$, PbO, $SiO_2$, $B_2O_3$, CdO, $Al_2O_3$, and CaO. The glass layer can be applied to the substrate 2 in any one of several ways. It can be applied by contact transfer printing, spraying, or charged particle deposition, for example. The composition also includes a suitable vehicle, such as ethyl cellulose resin, a flow control agent, such as furoic acid, a solvent, such as butyl carbitol acetate, and a surfactant. After application of the coating, it is air dried, then fired at temperatures of about 500° to about 900° C depending upon the glass composition. The glass constituents should be chosen to match the physical and chemical characteristics of the ceramic substrate. (An example of this type of glass is Du Pont 8190 with Du Pont 8250 thinner.)

I claim:

1. An article of manufacture comprising a refractory metal oxide dielectric substrate having disposed on a surface thereof a composite coating comprising a lower layer not more than about 0.4 mil thick after firing, said lower layer consisting essentially of from about 10–100% by weight of glass and from about 0–90% by weight of noble metals, said lower layer is fused to an upper layer consisting essentially of 1–2% by weight of glass and 98–99% by weight of noble metals, said upper layer having a thickness after firing more than twice that of said lower layer.

2. An article according to claim 1 including a coating of solder over said upper layer.

3. An article according to claim 1 in which said substrate is an alumina ceramic.

4. An article according to claim 1 in which said substrate is a beryllia ceramic.

5. An article according to claim 1 in which the composition of said glass includes oxides of bismuth, lead, cadmium, calcium, boron, aluminum, and silicon.

6. An article according to claim 5 in which said metals of said lower and upper layers consist essentially of platinum and gold.

7. An article according to claim 1 in which said lower layer is all glass.

8. An article according to claim 7 in which said lower layer is about 0.0001 inch thick.

* * * * *